United States Patent [19]
Lin

[11] Patent Number: 6,141,253
[45] Date of Patent: Oct. 31, 2000

[54] ELECTRICALLY PROGRAMMABLE SEMICONDUCTOR DEVICE WITH CONCURRENT PROGRAM AND VERIFICATION OPERATIONS

[75] Inventor: Chin-His Lin, Hsinchu, Taiwan

[73] Assignee: Macronix International Co., Ltd., Taiwan

[21] Appl. No.: 09/251,849

[22] Filed: Feb. 17, 1999

Related U.S. Application Data

[63] Continuation-in-part of application No. 08/918,796, Aug. 26, 1997, Pat. No. 5,959,892.

[51] Int. Cl.$^7$ .................................................. G11C 16/04
[52] U.S. Cl. ............................... 365/185.28; 365/185.03; 365/185.2; 365/185.4
[58] Field of Search ....................... 365/185.28, 185.03, 365/185.2, 185.21

[56] References Cited

U.S. PATENT DOCUMENTS

| | | | |
|---|---|---|---|
| 5,042,009 | 8/1991 | Kazerounian et al. | 365/185 |
| 5,163,021 | 11/1992 | Mehrotra et al. | 365/185 |
| 5,172,338 | 12/1992 | Mehrotra et al. | 365/185 |
| 5,218,569 | 6/1993 | Banks | 365/189.01 |
| 5,220,531 | 6/1993 | Blyth et al. | 365/189.07 |
| 5,293,560 | 3/1994 | Harari | 365/185 |
| 5,422,845 | 6/1995 | Ong | 365/185 |
| 5,463,586 | 10/1995 | Chao et al. | 365/210 |
| 5,550,772 | 8/1996 | Gill | 365/185.03 |
| 5,566,111 | 10/1996 | Choi | 365/185.22 |
| 5,590,070 | 12/1996 | Harrand et al. | 365/149 |
| 5,615,153 | 3/1997 | Yiu et al. | 365/185.19 |
| 5,638,323 | 6/1997 | Itano | 365/185.22 |
| 5,708,600 | 1/1998 | Hakozaki et al. | 365/185.03 |
| 5,712,815 | 1/1998 | Bill et al. | 365/185.03 |
| 5,729,489 | 3/1998 | Fazio et al. | 365/185.03 |
| 5,808,937 | 9/1998 | Chi et al. | 365/185.33 |
| 5,959,892 | 9/1999 | Lin et al. | 365/185.28 |

OTHER PUBLICATIONS

"2.2 Volt–only Flash Memory Technology", Advanced Micro Devices, Inc., (www.amd.com/products/nvd/overview/zerovolt/2.2spso.html [and 2.2hp.html]).

*Primary Examiner*—Richard Elms
*Assistant Examiner*—Tuan T. Nguyen
*Attorney, Agent, or Firm*—Beyer Weaver & Thomas LLP

[57] ABSTRACT

An electronically programmable semiconductor memory device that concurrently programs floating gate memory cells in the semiconductor memory device and verifies the programming of the memory cells is disclosed. Source-side voltage monitoring of the memory cells is used to verify programming concurrently with the programming of the memory cells. Threshold voltages of the memory cells are able to be programmed to three or more distinct voltage levels. Only a limited amount of die area is needed to obtain both high speed programming and concurrent verification.

27 Claims, 9 Drawing Sheets

ELECTRICALLY PROGRAMMABLE SEMICONDUCTOR DEVICE WITH CONCURRENT PROGRAM AND VERIFICATION OPERATIONS

CROSS-REFERENCE TO RELATED APPLICATIONS

This application is a continuation-in-part of U.S. patent application Ser. No. 08/918,796, filed Aug. 26, 1997, now U.S. Pat No. 5,959,892, which is hereby incorporated herein by reference for all purposes. This application is also related to U.S. patent application Ser. No. 09/229,460, now U.S. Pat. No. 6,046,934, filed Jan. 12, 1999 (Atty. Docket No.: 17538-274), and entitled "METHOD AND DEVICE FOR MULTI-LEVEL PROGRAMMING OF A MEMORY CELL", which is hereby incorporated herein by reference for all purposes.

BACKGROUND OF THE INVENTION

1. Field of the Invention

The present invention relates to semiconductor memory devices and, more particularly, to electrically programmable memory devices with improved programmability.

2. Description of the Related Art

Electronically programmable read only memory (EPROM), erasable electronically programmable read only memory (EEPROM) and Flash memory are classes of floating gate memory devices. More particularly, these floating gate memory devices are programmable memory devices which use floating gates as charge storage layers. Conventionally, programming of floating gate memories has been done in small programming steps wherein after the completion of each programming step a verifying operation must be performed to determine the validity of the last programming step. The verifying operation has typically been done as a separate operation. For example, such repetitive programming techniques are further described in U.S. Pat. No. 5,172,338 and U.S. Pat. No. 5,220,531. One disadvantage of these conventional repetitive programming techniques is that a long time is required for programming to complete largely because of the inefficiency of having to switch between a programming mode of operation and a verify mode of operation after each programming step. Another disadvantage of these conventional repetitive programming techniques is the need to repetitively switch between a high voltage levels used in a programming mode of operation and lower voltage levels used in a verify mode of operation.

More recently, a programming scheme for floating gate memories has been described in which the verifying operation is able to be done concurrently with the programming operation. Here, the programming is achieved over various phases. A differential pair amplifier monitors the programming operation to detect if a programming phase has been completed. More particularly, the differential pair amplifier compares a voltage on a selected bit line with a program-verify voltage produced by a bandgap derived reference generator. Upon the completion of a particular programming phase, the bandgap reference will be set to another program-verify voltage that corresponds to the next programming level. This technique is described in greater detail in U.S. Pat. No. 5,712,815, which is herein incorporated by reference. One disadvantage of this approach is that implementation of a bandgap derived reference generator requires a large amount of semiconductor die area to implement (typically, on the order of 15 gates and at least one bipolar transistors). Therefore, only a limited number of bandgap reference generators are able to be practically utilized in a semiconductor memory device. Another disadvantage of this approach is that in order to program memory cells a series of programming phases are needed. As a result, the programming and verification operations still require a significant amount of time to complete.

In the view of the foregoing, there is a need for faster and more efficient schemes for programming electrically programmable memory cells.

SUMMARY OF THE INVENTION

Broadly speaking, the invention relates to an electronically programmable semiconductor memory device that is able to rapidly concurrently program floating gate memory cells in the semiconductor memory device and verify the programming of the memory cells. Source-side voltage monitoring of memory cells is used to verify programming concurrently with the programming of the memory cells. Threshold voltages of the memory cells are able to be programmed to three or more distinct voltage levels. The invention requires only limited amounts of die area to provide both high speed programming and concurrent verification.

The invention can be implemented in numerous ways, including as a device, an apparatus and a method. Several embodiments of the invention are discussed below.

As a semiconductor memory device, one embodiment of the invention includes a plurality of floating gate memory cells, each of said memory cells can be programmed to three or more different threshold voltage levels; and a plurality of memory cell program circuits, each of said memory cell program circuits being simultaneously operatively connected to one of said memory cells, and each of said memory cell program circuits operates to simultaneously program any one of the different threshold voltage levels to the corresponding one of said memory cells while using source side monitoring to concurrently determine when the programming is complete.

As an electrically programmable semiconductor memory device, one embodiment of the invention includes: a word line; a memory cell transistor having a programmable threshold voltage, a drain terminal, a gate terminal, a source terminal and floating gate, the gate terminal being connected to said word line; a reference level transistor having a drain terminal, a gate terminal and a source terminal, the gate terminal receiving a reference level signal, and the drain terminal being connected to the source terminal of said memory cell transistor; a sense amplifier having an input terminal operatively connected to the source terminal of said reference level transistor, said sense amplifier detects a predetermined signal level on the input terminal; and a program controller operatively connected to said sense amplifier and the drain terminal of said memory cell transistor, said program controller supplies a high voltage signal to the drain terminal of said memory cell transistor during programming, and when said sense amplifier detects the predetermined signal level on the input terminal the programming of said memory cell transistor is stopped by removing the high voltage signal from the drain terminal of said memory cell transistor.

As a semiconductor memory device, another embodiment of the invention includes: an array of floating gate memory cells, each of said memory cells can be programmed to three or more different threshold voltage levels; and a plurality of cell program means, each of said cell program means for simultaneously programming any one of the different threshold voltage levels in the corresponding one of said memory cells while using source side monitoring to concurrently determine when the programming is complete, whereby different threshold voltage levels are concurrently programmed into different ones of said memory cells.

The invention has numerous advantages. Different implementations or embodiments of the invention may have one or more of the following advantages. One advantage is that memory cells are able to be programmed at high speed. Another advantage is that the verification circuits also make efficient use of die area of the semiconductor memory device such that each bit line in a memory cell array can practically have its own verification (program control) circuit. Still another advantage of the invention is that different threshold voltage levels can be simultaneously programmed in memory cells of different bit lines.

Other aspects and advantages of the invention will become apparent from the following detailed description, taken in conjunction with the accompanying drawings, illustrating by way of example the principles of the invention.

BRIEF DESCRIPTION OF THE DRAWINGS

The present invention will be readily understood by the following detailed description in conjunction with the accompanying drawings, wherein like reference numerals designate like structural elements, and in which.

DETAILED DESCRIPTION OF THE INVENTION

The invention pertains to an electronically programmable semiconductor memory device that is able to concurrently program floating gate memory cells in the semiconductor memory device and verify the programming of the memory cells. Source-side voltage monitoring of the memory cells is used to verify programming concurrently with the programming of the memory cells. Threshold voltages of the memory cells are able to be programmed to three or more distinct voltage levels. The invention requires only limited amounts of die area to provide both high speed programming and concurrent verification.

Figure 1:
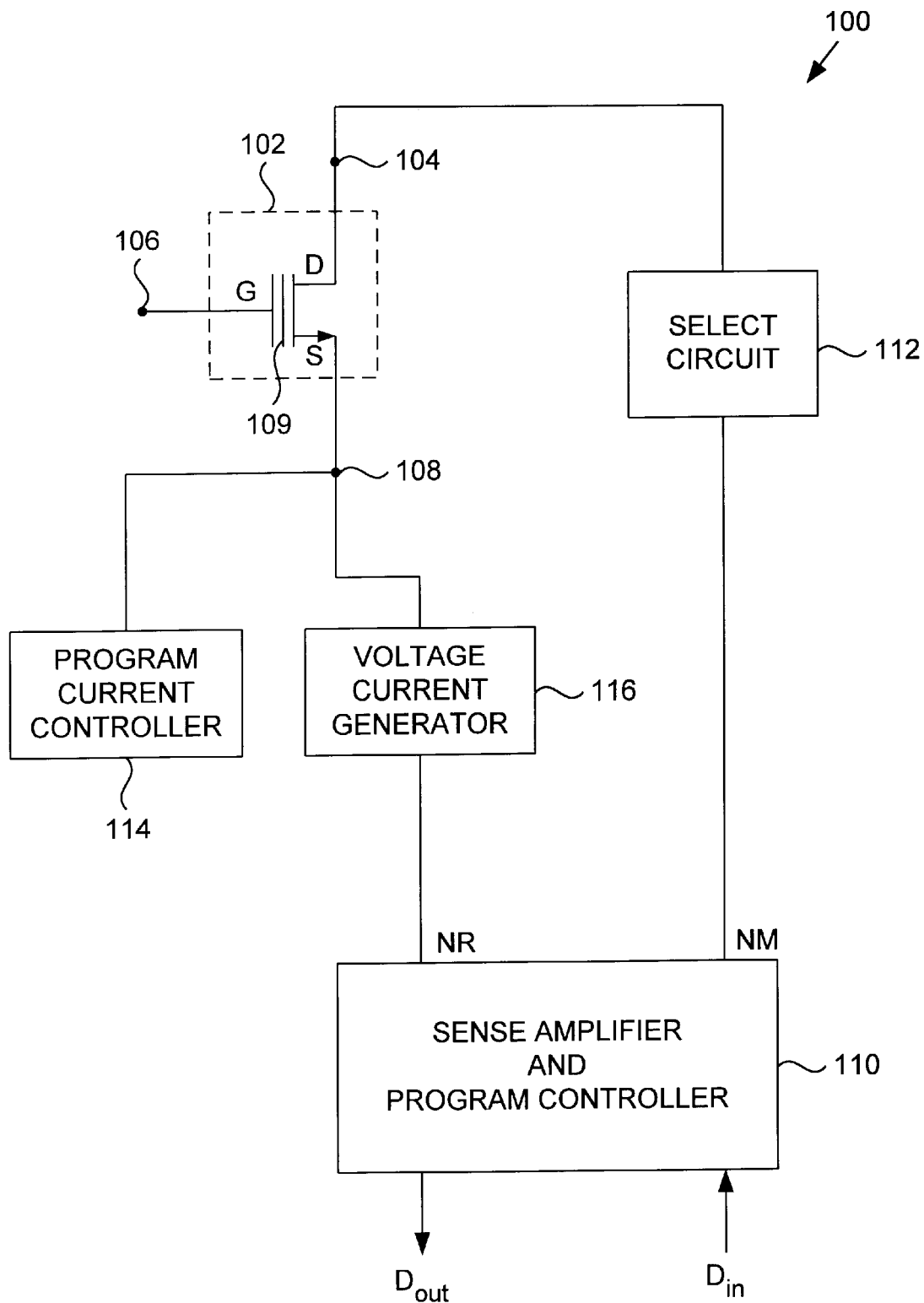
FIG. 1 is a block diagram of an electronically programmable semiconductor memory device according to an embodiment of the invention.

FIG. 1 is a block diagram of an electronically programmable semiconductor memory device 100 according to an embodiment of the invention. The electronically programmable semiconductor memory device 100 illustrated in FIG. 1 represents only that portion of a conventional electronically programmable semiconductor memory device that pertains to the programming and verification of a memory cell within the semiconductor memory device. Hence, various selectors, decoders and address circuits that are well known and not shown or described herein. Also, although a plurality of memory cells can be concurrently programmed and verified by the invention, only a single floating gate memory cell is detailed in FIG. 1.

The electronically programmable semiconductor memory device 100 includes a memory cell 102. The memory cell 102 has a drain terminal 104, a gate terminal 106, a source terminal 108 and a floating gate 109. The memory cell 102 is preferably a floating gate type Metal-Oxide-Semiconductor (MOS) Field Effect Transistor (FET). The memory cell 102 illustrated in FIG. 1 is an N-type MOS (NMOS) transistor. The memory cell 102 supports more than two (2) different threshold voltage levels that are able to be programmed into the memory cell 102. In particular, in the implementation of the invention discussed below, the memory cell 102 supports four (4) different threshold voltage levels. By using the four (4) different threshold levels, the memory cell 102 can effectively store two (2) bits of information.

The invention uses a ground pull-down scheme to perform hot electron programming of the threshold voltage of the memory cell 102 to multiple levels. In general, during programming, the drain terminal 104 and the gate terminal 106 are held to a high voltage level, and the voltage appearing at the source terminal 108 for the memory cell 102 is monitored. The change in voltage at the source terminal 108 corresponds to a change in the source side voltage of the memory cell 102 which is in turn related to a change in the threshold voltage of the memory cell 102. Hence, by monitoring the source side voltage appearing at the source terminal 108, the electronically programmable semiconductor memory device 100 can determine when the appropriate threshold voltage level has been programmed into the memory cell 102.

The electronically programmable semiconductor memory device 100 also includes a sense amplifier and program controller 110, a select circuit 112, a program current controller 114, and a voltage-current generator 116. The sense amplifier and program controller 110 (namely, the program controller portion) serves to control the programming of the threshold voltage level for the memory cell 102. The threshold voltage level of the memory cell 102 is programmed in accordance with an input data value ($D_{IN}$). Also, as conventionally known, the sense amplifier and program controller 110 (namely, the sense amplifier portion) is able to read the threshold voltage level stored in the memory cell 102 during a read operation (by sensing the current through the memory cell 102) and supply it as an outward data value ($D_{OUT}$).

During the programming of the threshold voltage level of the memory cell 102, the select circuit 112 couples the drain terminal 104 to the sense amplifier and program controller 110 at terminal NM. This acts to supply a high voltage level to the drain terminal 104 for the programming of the threshold voltage level. Although not shown, the gate terminal 106 is also coupled to a high voltage level for the programming of the threshold voltage level. The program current controller 114 is also activated during the programming operation to couple the source terminal 108 to ground in a controlled manner, thus this programming approach is referred to as a ground pull-down scheme. When programming begins, the voltage on the source terminal 108 is a high voltage that corresponds to a precharge condition. The program current controller 114 thereafter causes the voltage on the source terminal 108 to drop due to current flowing to ground through the program current controller 114. Since the threshold voltage of the memory cell 102 is associated with the voltage at the source terminal 108, while the source terminal 108 voltage is declining, the threshold voltage level of the memory cell 102 is increasing. In other words, the program current controller 114 is operating to program the threshold voltage level for the memory cell 102 to a desired voltage level.

During the programming of the threshold voltage level, the source terminal 108 is also coupled to terminal NR of the sense amplifier and program controller 110 through the voltage-current generator 116. The voltage-current generator 116 operates to convert the voltage at the source terminal 108 to a current value before being supplied to the terminal NR of the sense amplifier and program controller 110. By altering the predetermined amount for the voltage-current generator 116, different threshold voltage levels can be programmed into the memory cell 102. As the voltage at the source terminal 108 drops due to the current being supplied to ground through the programmed current controller 114, the sense amplifier and program controller 110 monitors the current through the voltage-current generator 116. In one embodiment, the current through the voltage-current generator 116 is the current through the memory cell 102 minus the current through the programmed current controller. Once the voltage appearing at the terminal NR drops to a predetermined level (e.g., near 2.0 volts), the sense amplifier and program controller 110 is able to determine that the programming of the threshold voltage level for the memory cell 102 is completed and thus causes the select circuit 112 to disconnect the terminal NM of the sense amplifier and program controller 110 from the drain terminal 104 of the memory cell 102 so as to remove the high voltage level from the drain terminal 104. As a result, the programming of the threshold voltage level for the memory cell 102 is stopped. By using different voltage driven programmed voltage-current generators 116, different threshold voltage levels are able to be programmed into the memory cell 102.

Figure 2:
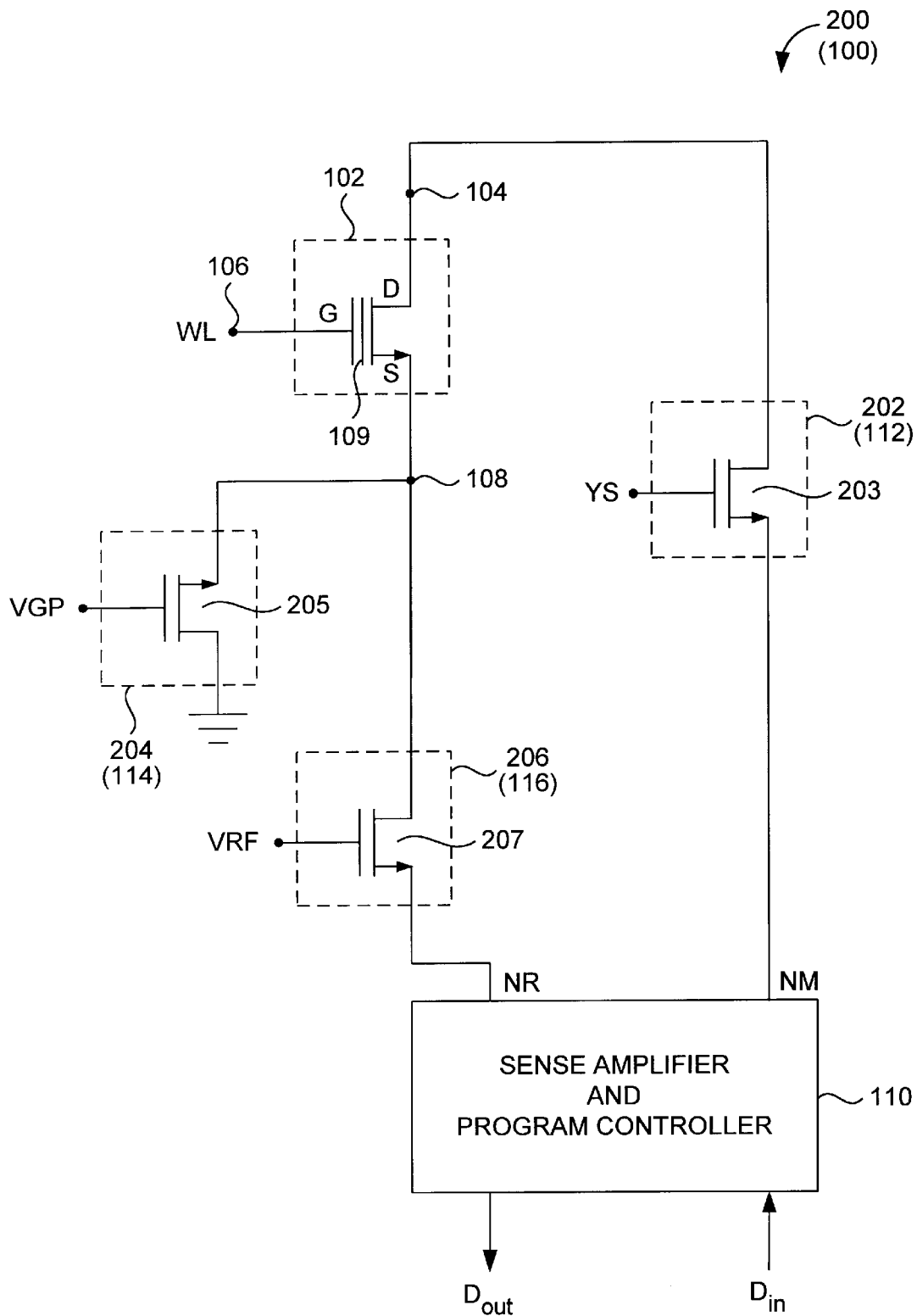
FIG. 2 is a block diagram of an electronically programmable semiconductor memory device according to one embodiment of the invention.

FIG. 2 is a block diagram of an electronically programmable semiconductor memory device 200 according to one embodiment of the invention. The electrically programmable semiconductor memory device 200 is, for example, a more detailed embodiment of the electrically programmable semiconductor memory device 100 illustrated in FIG. 1.

More particularly, the electrically programmable semiconductor memory device 200 includes a select circuit 202 that includes a NMOS transistor 203. The NMOS transistor 203 includes a drain terminal connected to the drain terminal 104 of the memory cell 102, a source terminal connected to the terminal NM of the sense amplifier and program controller 110, and a gate terminal connected to receive a select signal YS. The select circuit 202 represents one embodiment for the select circuit 112 illustrated in FIG. 1.

The electrically programmable semiconductor memory device 200 also includes a program current controller 204.

Figure 10:
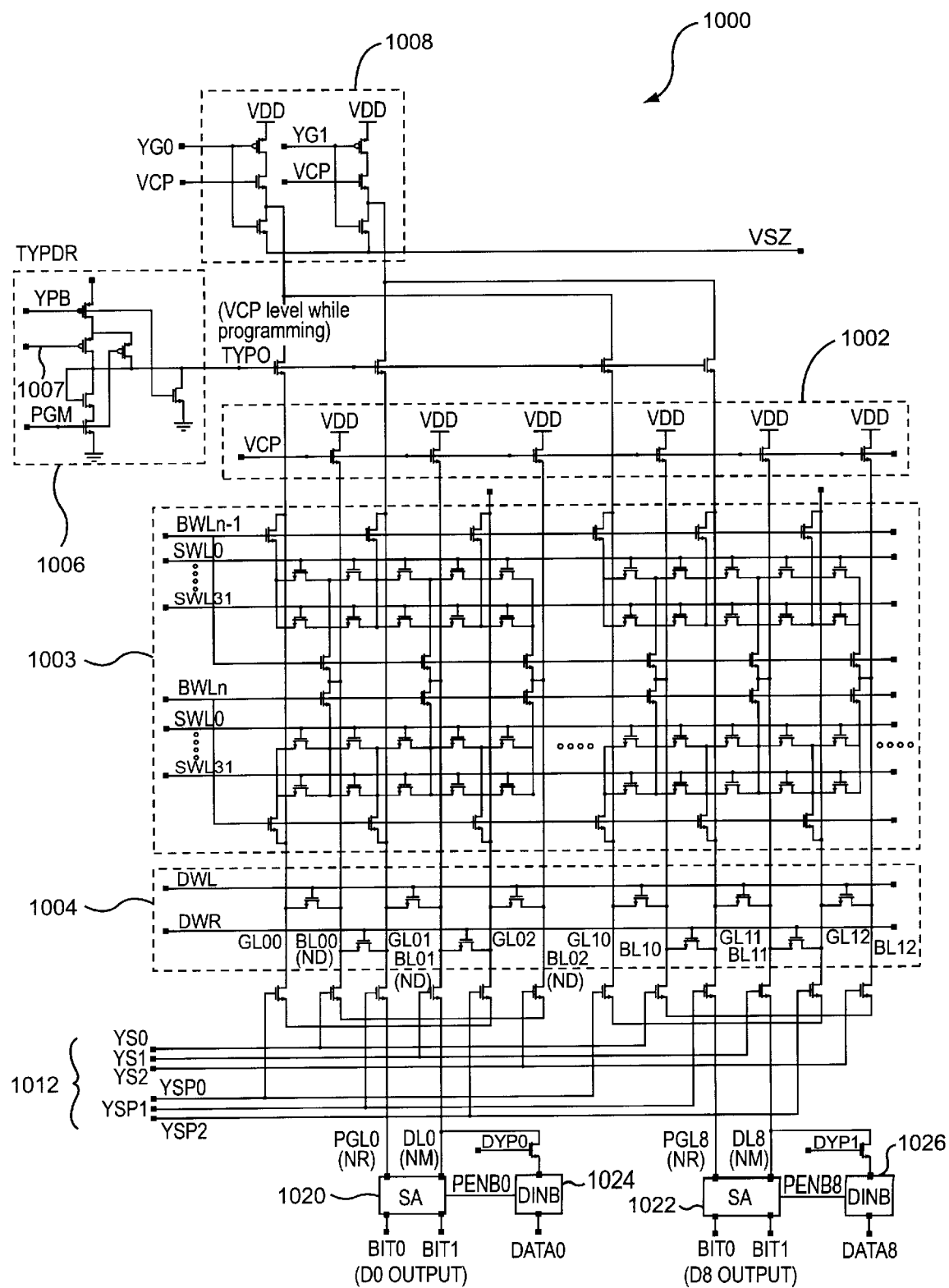
FIG. 10 is a schematic diagram for an electronically programmable semiconductor memory device according to still another embodiment of the invention.

The program current controller 204 includes a NMOS transistor 205. The NMOS transistor 205 includes a drain terminal connected to the source terminal 108 of the memory cell 102, a source terminal connected to ground, and a gate terminal connected to receive a program voltage signal (VGP). During programming of the threshold level of the memory cell 102, the voltage program signal (VGP) activates the NMOS transistor 205 to at least partially turn on the transistor 205 to cause the voltage at the source terminal 108 (and thus the threshold voltage level of the memory cell 102) to be reduced in a controlled manner. The controlled pull-down of the source terminal 108 is thus provided by the program voltage signal (VGP) and the characteristics of the NMOS transistor 205. The program current controller 204 represents one embodiment for the program current controller 114 illustrated in FIG. 1. According to one embodiment, the transistor is part of a current limiter circuit that controls the amount of current flowing to ground. FIG. 10 discussed below shows an exemplary current limiter circuit.

In addition, the electrically programmable semiconductor memory device 200 includes a voltage-current generator 206. The voltage-current generator 206 includes a NMOS transistor 207 that provides a voltage-current conversion between the source terminal 108 and the terminal NR of the sense amplifier and program controller 110. The NMOS transistor 207 includes a drain terminal connected to the source terminal 108 of the memory cell 102, a source terminal connected to the terminal NR of the sense amplifier and program controller 110, and a gate terminal connected to receive a reference voltage signal (VRF). The voltage-current conversion provided by the voltage-current generator 206 is determined by the characteristics of the NMOS transistor 207 as well as with the voltage level applied to the gate terminal by the reference voltage signal (VRF). Hence, the voltage at the source terminal 108 is determined by the characteristics of the NMOS transistor 207, the reference voltage signal (VRF), the NMOS transistor 205, and the program voltage signal (VGP). The NMOS transistor 207 may or may not be a floating gate memory device. The voltage-current generator 206 represents one embodiment for the voltage-current generator 116 illustrated in FIG. 1. During the programming operation, it should also be noted that the gate terminal 106 is coupled to a word line (WL) of the memory cell array and is also maintained in an active condition such that the memory cell 102 is programmed.

According to one embodiment, the threshold voltage (Vth) of the memory cell 102 and the word line voltage (VWL) (gate voltage) are related to the threshold voltage (Vt) for the NMOS transistor 207 and the reference voltage signal (VRF), namely:

$$VWL - Vth = VRF - Vt$$

Accordingly, the reference voltage signal (VRF) can be determined as follows:

$$VRF = VWL - Vth + Vt$$

Figure 3:
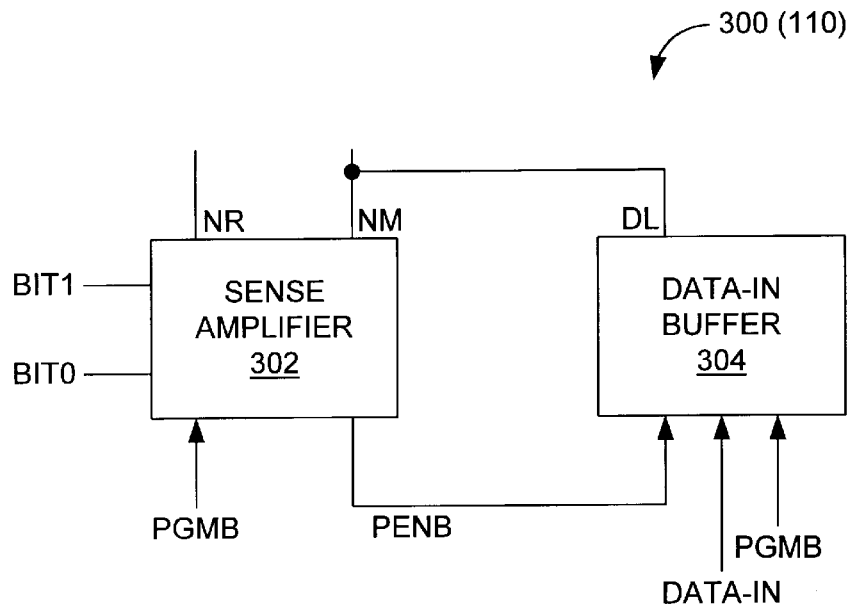
FIG. 3 is a block diagram of a sense amplifier and program controller according to one embodiment of the invention.

FIG. 3 is a block diagram of a sense amplifier and program controller 300 according to one embodiment of the invention. The sense amplifier and program controller 300 is, for example, suitable for use as one embodiment of the sense amplifier and program controller 110 illustrated in FIG. 1. The sense amplifier and program controller 300 includes a sense amplifier 302 and a data-in buffer 304. In general, a semiconductor memory device includes a sense amplifier to sense the data value stored in a particular memory cell. Here, the sense amplifier 302 performs such conventional functions as well as additionally participates in the programming of the threshold voltage levels for the memory cell. A data-in value (DATA-IN) is supplied to the data-in buffer 304 to indicate the data value to be stored in the particular memory cell. In other words, the data-in value (DATA-IN) determines the particular threshold voltage level to be programmed in the memory cell. For example, if the memory cells can be programmed to one of four levels, then the data value to be stored in the memory cell can also be one of four values.

Additionally, a program request signal bar (PGMB) is supplied to the sense amplifier 302 and the data-in buffer 304 to initiate the programming operation. During the programming operation, the sense amplifier 302 operates to sense when the voltage at the source terminal 108 of the memory cell 102 has dropped to a level that is associated with the desired threshold voltage. When the sense amplifier 302 determines during programming that the voltage level has not yet declined to the value corresponding to the desired threshold voltage, a program enable signal bar (PENB) remains active (low) to signal the data-in buffer 304 to continue with the programming of the threshold voltage level. In such case, the data-in buffer 304 maintains its output line (DL) at a high voltage level (e.g., 6 volts). Once the sense amplifier 302 determines that the voltage level appearing at the terminal NR has declined such that it is associated with the desired threshold voltage level for the memory cell 102, the sense amplifier 302 causes the program enable signal bar (PENB) to deactivate (i.e., go to a high level) and thus signals the data-in buffer 304 to cease programming of the memory cell 102. In such case, the data-in buffer 304 causes the output voltage line (DL) to go to a low voltage level. As a result, the terminal NM of the sense amplifier and program controller 110 is pulled low which in turn pulls the drain terminal 104 low to cease the programming of the memory cell 102.

Figure 4:
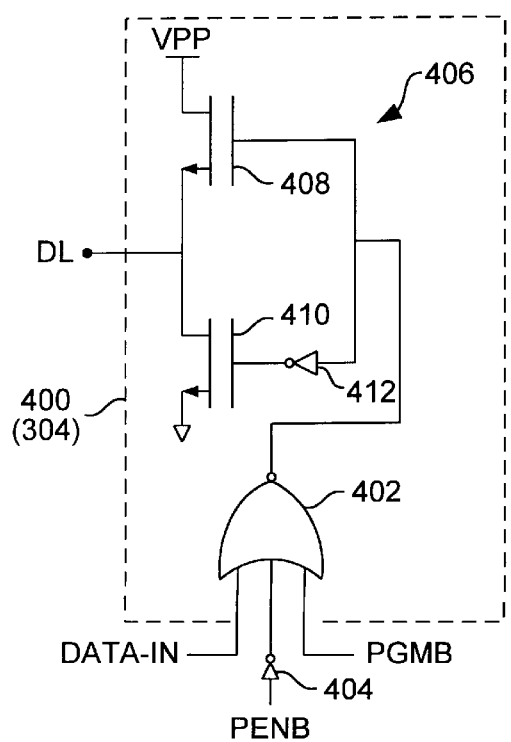
FIG. 4 is a schematic diagram of a data-in buffer according to one embodiment of the invention.

FIG. 4 is a schematic diagram of a data-in buffer 400 according to one embodiment of the invention. The data-in buffer 400 is, for example, suitable for use as the data-in buffer 304 illustrated in FIG. 3. The data-in buffer 400 includes a NOR circuit 402, an inverter 404, and an output circuit 406. The NOR circuit 402 receives one input from the data-in value (DATA-IN), another input from a program request signal bar (PGMB), and still another input from the program enable signal bar (PENB) through the inverter 404. The output of the NOR circuit 402 is supplied to the output circuit 406. The output circuit 406 is a push-pull output circuit that produces the output voltage on the output line (DL). The output circuit 406 includes a first NMOS transistor 408, a second NMOS transistor 410, and an inverter 412 interconnected as shown in FIG. 4. Based on the voltage of the output of the NOR circuit 402, the output circuit 406 either produces a high voltage signal on the output line (DL) or a low voltage level (e.g., ground) on the output line (DL).

Figure 5:
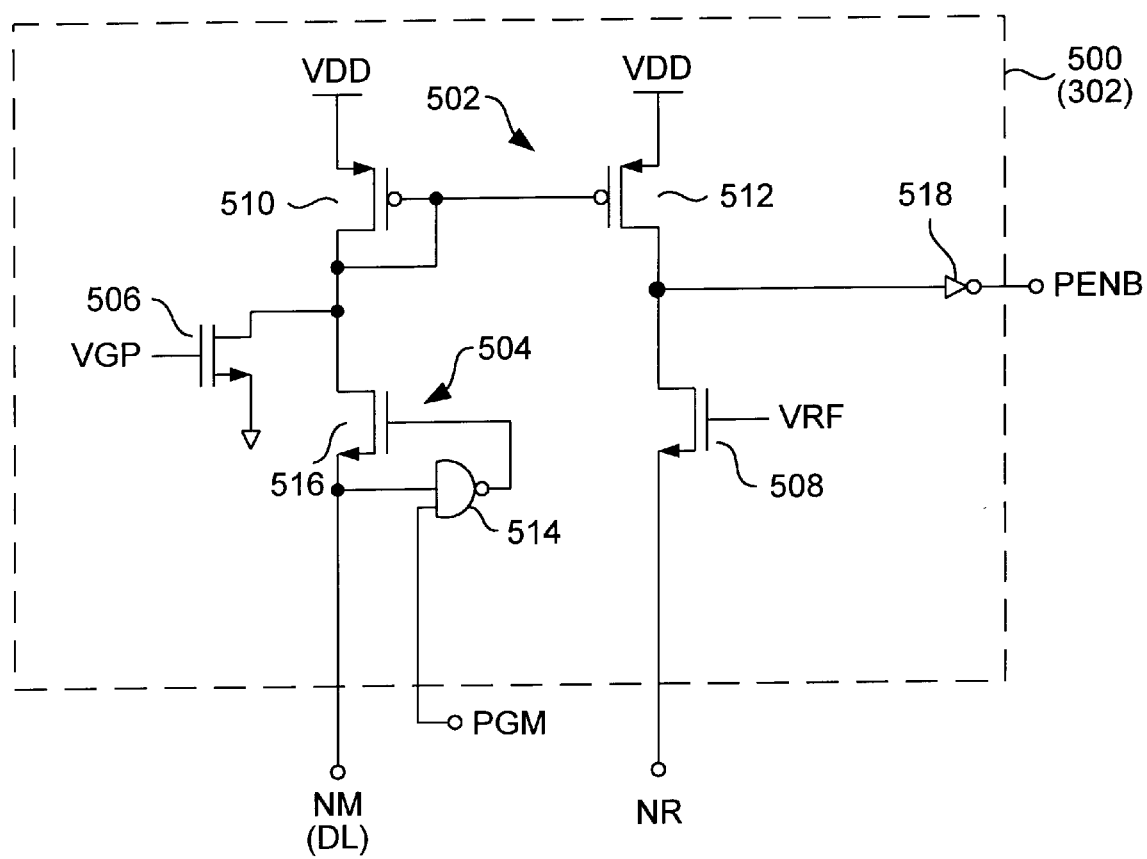
FIG. 5 is a schematic diagram of a sense amplifier according to one embodiment of the invention.

FIG. 5 is a schematic diagram of a sense amplifier 500 according to one embodiment of the invention. The sense amplifier 500 is, for example, suitable for use as the sense amplifier 302 illustrated in FIG. 3. The sense amplifier 500 includes a mirror circuit 502, a control circuit 504, a program FET 506, and a reference FET 508. The mirror circuit 502 includes PMOS FETs 510 and 512 having source terminals connected to a positive voltage source (VDD) and having their gate terminals commonly connected. The control circuit 504 includes a NAND gate 514 and a NMOS FET 516. The NAND gate 514 receives the program recluest signal (PGM) and the output voltage on the output line (DL) as inputs, and produces a gate control signal for the NMOS FET 516. The drain terminal of the NMOS FET 516 is connected to the drain terminal of the PMOS FET 510, and the source terminal of the NMOS FT 516 is connected to the terminal NM (and the output line (DL)). The program FET 506 has a gate terminal that receives the program voltage signal (VGP), a drain terminal that connects to the drains of the FETs 510 and 516, and a source terminal connect to ground. The reference FET 508 has a gate terminal that receives the reference voltage signal (VRF), a drain terminal connected to the drain terminal of the PMOS FET 512, and a source terminal connected to the terminal NR. The sense amplifier 500 produces the program enable signal bar (PENB) via the inverter 518 which inverts the signal at the drain terminal of the FET 512. Although not shown in FIG. 5, the sense amplifier 302 also provides for reading data from the memory cell to yield the bit0 and bit1 outputs (see FIG. 9). It should be noted that the reference FET 508 represents the NMOS transistor 207 in FIG. 2. The program FET 506 is used as a current source level to determine whether programming has been achieved or not. By driving the program FET 506 by the program voltage signal (VGP), better tracking with the programming current is achieved (controlled by NMOS transistor 205 in FIG. 2).

Figure 6:
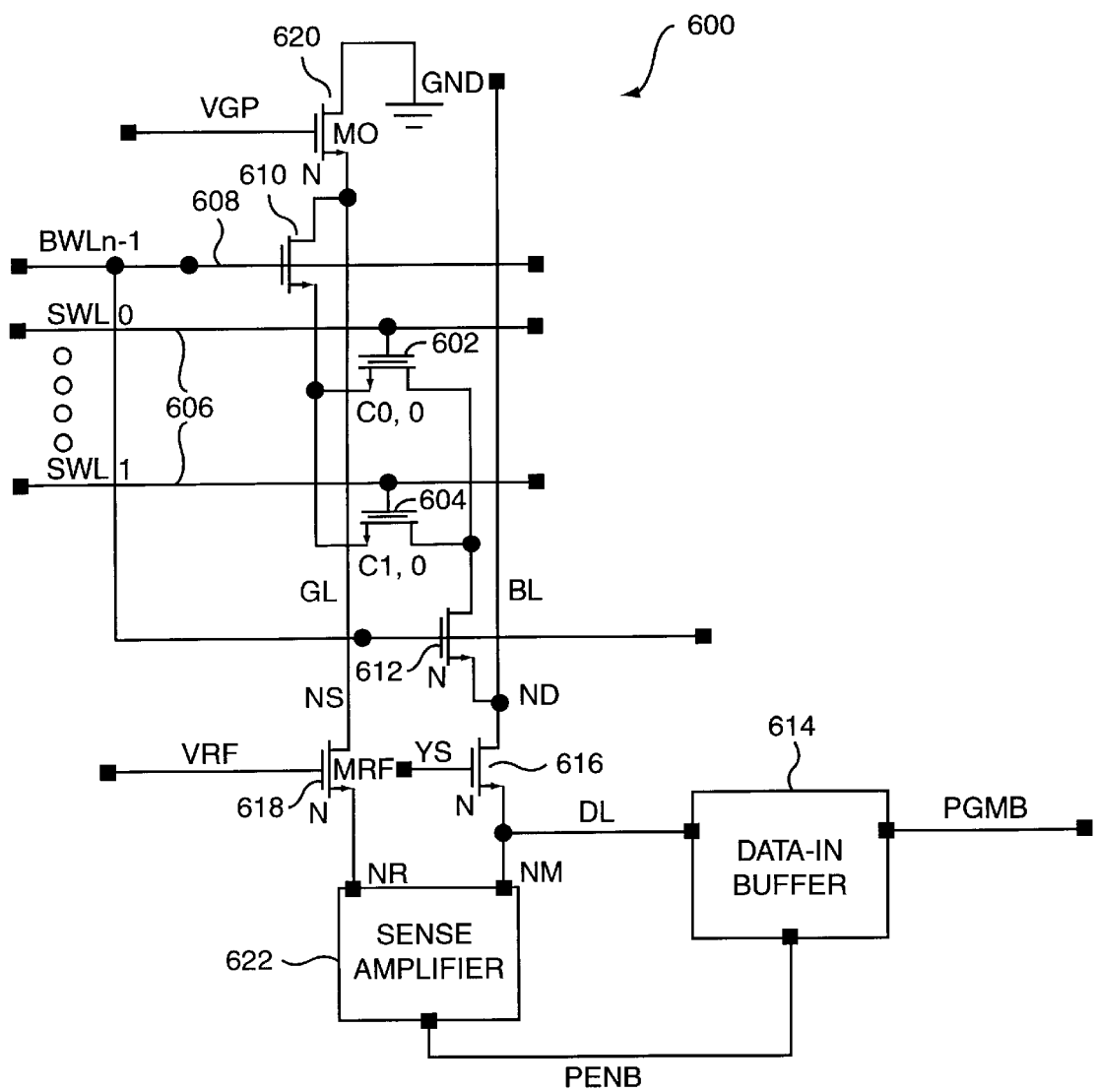
FIG. 6 is a schematic diagram for an electronically programmable semiconductor memory device according to another embodiment of the invention.

FIG. 6 is a schematic diagram for an electronically programmable semiconductor memory device 600 according to another embodiment of the invention. The electronically programmable semiconductor memory device 600 illustrates additional decoding and selection circuitry than shown in FIGS. 1 and 2. The electronically programmable semiconductor memory device also shows circuitry similar to that shown in FIG. 3.

The electronically programmable semiconductor memory device 600 represents circuitry associated with a bit line (BL) and a ground line (GL) in a memory cell array. The memory cell array includes m a ny bit lines and word lines. The bit line (BL) and the ground line (GL) shown in FIG. 6 are selected by the bank select signal (BWLn-1) 608. The bank select signal 608 supports a plurality of memory cells (C0, C1, . . . ) 602 and 604 that couple to the particular bit line (BL) and ground line (GL). The memory cells for a particular bit line are selected through the word lines (SWL0, . . . , SWL1) 606. The memory cells 602 and 604 represent two memory cells associated with the plurality of word lines. A select transistor 610 operates in accordance with the bank select signal (BWLn-1) 608 to couple the source terminal of the memory cells 602 and 604 to the ground line (GL). The word lines (SWL) then select one of the memory cells 602 and 604 associated with the particular bit line (BL) and ground line (GL) being activated. A select transistor 612 also operates in accordance with the bank select signal (BWLn-1) 608 to couple the drain terminal of the memory cells 602 and 604 to the bit line (BL). The bit line (BL) is also referred to as a drain line (ND), and the ground line (GL) is also referred to as a source line (NS).

A data in buffer 614 receives a program request signal bar (PGMB) and operates to produce an output voltage on output line (DL) that is coupled to the drain line (ND) through a select transistor 616. The select transistor 616 is controlled by a control signal (YS). During the program operation, the control signal (YS) operates to activate the select transistor 616. A voltage-current generator transistor 618 couples between the source line (NS) and a first terminal (NR) of the sense amplifier 622. The voltage-current generator transistor 618 is controlled by a voltage reference signal (VRF) to produce the desired current for the first terminal of the sense amplifier 622. The output line (DL) of the data-in buffer 614 is also connected to a second terminal (NM) of the sense amplifier 622. IN one embodiment, the voltage-current generator transistor 618 is a floating gate memory device. To discharge charges from the selected memory cell (602 or 604) when the threshold voltage for the memory cell is being programmed, a discharge transistor 620 is coupled between ground and the ground line (GL). The discharge transistor 620 is activated by a voltage programming signal (VGP). The voltage programming signal (VGP) thus causes the discharge transistor 620 to discharge current or charge from the memory cell so as to gradually program the threshold voltage of the memory cell. The rate at which the charge or current passes through the discharge transistor 620 from the ground line (GL) to ground is controlled by the volt age of the voltage programming signal (VGP).

Representative voltage levels at various locations in the electronically programmable semiconductor memory device 600 are identified in the following table.

| Programmed State | $V_{NS}$ | $V_{ND}$ | Vth | VRF |
|---|---|---|---|---|
| Vth0 | N/A | N/A | 1.5–2.0 v | N/A |
| Vth1 | ~3.3 v | ~6.75 v | 3.0–3.4 v | 4.0 v |
| Vth2 | ~2.3 v | ~6.75 v | 4.0–4.4 v | 3.0 v |
| Vth3 | ~0.3 v | ~6.75 v | 6.0–6.4 v | 1.0 v |

Figure 7:
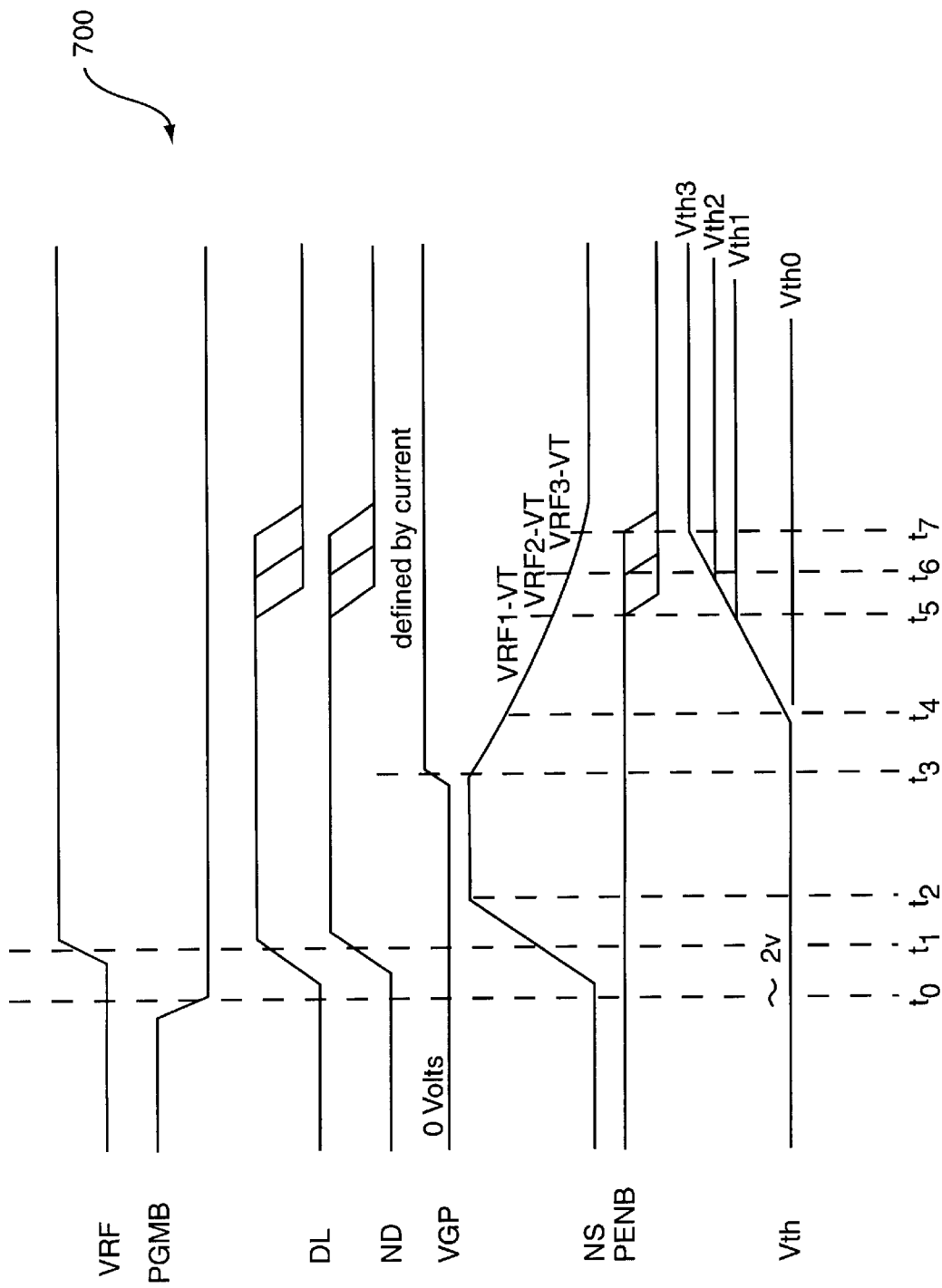
FIG. 7 is a timing diagram of the programming operation of threshold voltages in memory cells according to one embodiment of the invention.

The programming operation according to the invention for the programming of threshold voltages in memory cells is described below with reference to FIG. 7 which illustrates a timing diagram 700. When programming is first initiated at time t0, the program enable signal bar (PENB) is already high so as to enable programming and the program request signal bar (PGMB) transitions from a high level to a low level to start the programming. At approximately time t1, the data-in buffer (304, 614), the output line (DL) as well as the drain line (ND) transitions from a low level to a high level. At about the same time, the voltage reference signal (VRF) transitions from a low level to a high level to monitor the source line (NS). After time t1 and until time t2, the source line (NS) climbs from a low level to a high level, which in effect precharges the source-side voltage of the memory cell being programmed. At time t3, the source line (NS) is coupled to a low voltage potential (e.g., 3.5 volts) and the voltage appearing on the voltage programming signal (VGP) is defined by current. At time t4, the programming of the threshold voltage is initiated by the voltage programming signal transitioning from a low level (e.g., 2 volts) to an intermediate level to produce a desired current level through the program current controller (114, 204) which operates to gradually lower the source line (NS). Soon after the source line (NS) begins to be lowered, at time t4, the threshold voltage (Vth) begins to increase so as to be programmed to one of a plurality of threshold voltage levels ($V_{th0}$, $V_{th1}$, $V_{th2}$, and $V_{th3}$). The threshold voltage level $V_{th}$ is the default level, and the other threshold voltage levels ($V_{th1}$, $V_{th2}$, or $V_{th3}$) are obtained by the programming. Namely, at time t5, the programming is stopped by bringing the program enable signal bar (PENB) to a low level, thus causing the threshold voltage (Vth) to be programmed to the threshold voltage level $V_{th1}$. Also, at about the same time, the output line (DL) and the drain line (ND) transitions to a low level. If instead the threshold voltage (Vth) is to be programmed to the threshold voltage level $V_{th2}$, the programming is stopped at time t6 by bringing the program enable signal (PENB) to a low level. Likewise, it the threshold voltage (Vth) is to be programmed to the threshold voltage level $V_{th3}$, the programming is stopped at time t7 by bringing the program enable signal bar (PENB) to a low level.

The different threshold levels are able to be programmed concurrently for a plurality of bit lines. According to one embodiment of the invention, the programming of the different threshold levels is determined by controlling the programmed voltage-current generation (116, 206). Hence, to program the threshold voltage levels ($V_{th1}$, $V_{th2}$ and $V_{th3}$) progressively larger programmed voltage-current generators are used.

Figure 8:
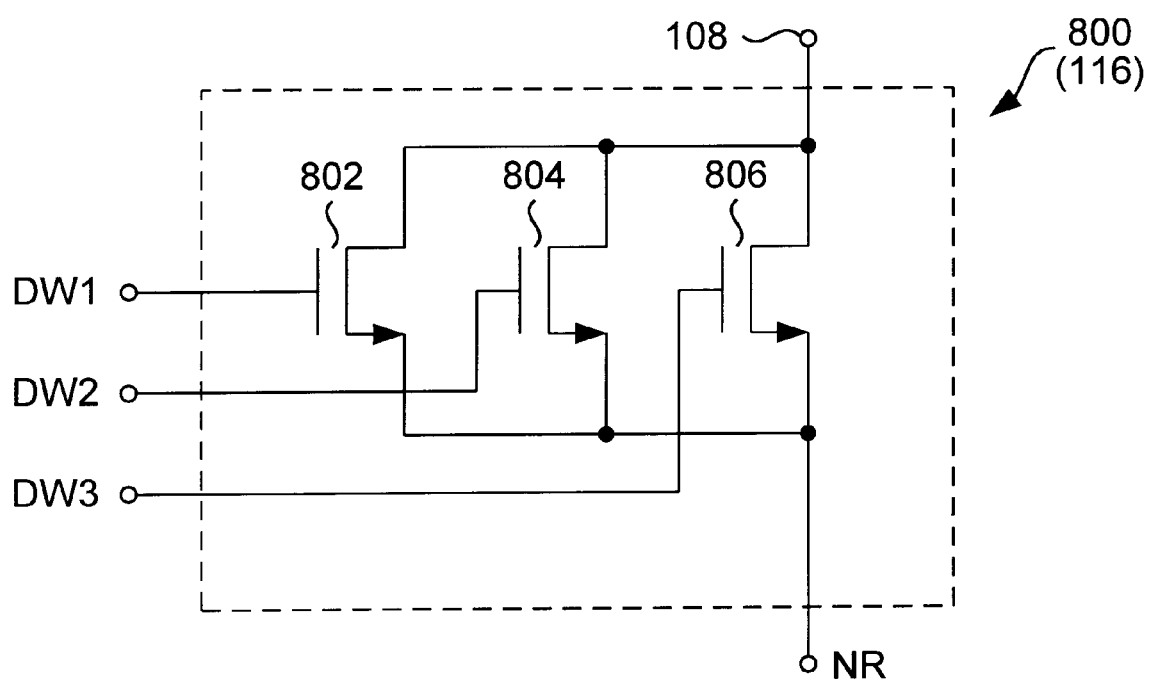
FIG. 8 is a schematic diagram of a programmed voltage-current generator circuit according to one embodiment of the invention.

FIG. 8 is a schematic diagram of a programmed voltage-current generator circuit 800 according to one embodiment of the invention. The programmed voltage-current generator circuit 800 is, for example, suitable for use as the programmed voltage-current generator 116 illustrated in FIG. 1. The programmed voltage-current generator circuit 800 is able to provide three different reference currents using a first NMOS FET 802, a second NMOS FET 804 and a third NMOS FET 806. The first NMOS FET 802 is controlled by a first voltage control signal (DW1), the second NMOS FET 804 is controlled by a second voltage control signal (DW2), and the third NMOS FET 806 is controlled by a third voltage control signal (DW3). The voltage control signals (DW1, DW2 and DW3) are reference voltage signals and correspond to VFR1, VRF2 and VRF3 (see FIG. 7). By selectively activating one of the FETs 802, 804 and 806, three different voltage-current generators can be provided. For example, the programmed voltage-current generator for the threshold voltage level ($V_{th1}$) can be provided by activating only the NMOS FET 802. As another example, the programmed voltage-current generator for the threshold voltage level ($V_{th2}$) can be provided by activating the FETs 804. As still another example, the programmed voltage-current generator for the threshold voltage level ($V_{th3}$) can be provided by activating the FETs 806. The FETs 802, 804 and 806 can also be referred to as dummy transistors. In one embodiment, the FETs 802, 804 and 806 are floating gate memory devices.

Figure 9:
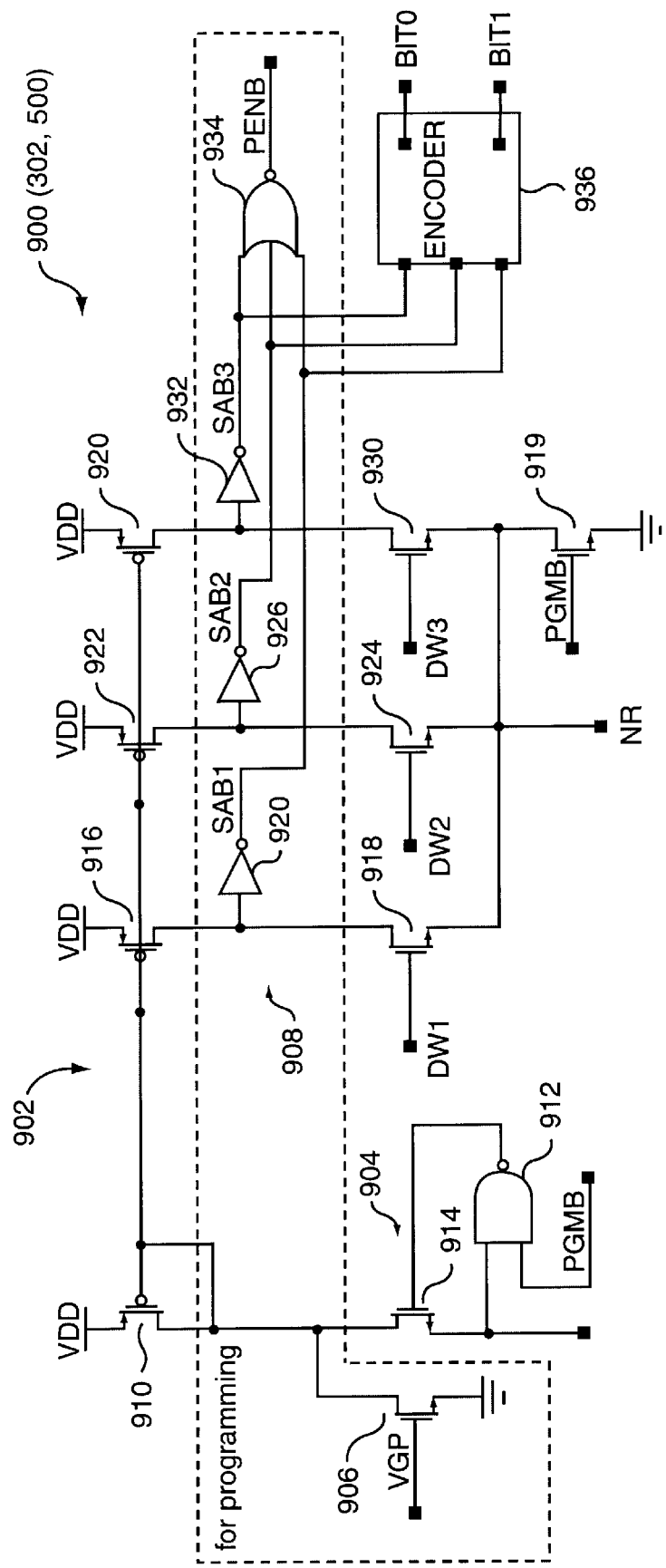
FIG. 9 is a schematic diagram of a sense amplifier according to another embodiment of the invention.

FIG. 9 is a schematic diagram of a sense amplifier 900 according to another embodiment of the invention. The sense amplifier 900 is, for example, suitable for use as the sense amplifier 302 illustrated in FIG. 3 or as a more detailed embodiment of the sense amplifier 500 illustrated in FIG. 5. The sense amplifier 900 provides for multi-level sensing of the threshold voltage levels.

The sense amplifier 900 includes a mirror circuit 902, a control circuit 904, a program FET 906, and an output circuit 908. The control circuit 904 includes a NAND gate 912 and a NMOS FET 914. The NAND gate 912 receives the program request signal bar (PGMB) and the output voltage on the output line (DL) as inputs, and produces a gate control signal for the NMOS FET 914. The drain terminial of the NMOS FET 914 is connected to the drain terminal of the PMOS FET 910, and the source terminal of the NMOS FET 914 is connected to the terminal NM (and tie output line (DL)). The program FET 906 has a gate terminal that receives the program voltage signal (VGP), a drain terminal that connects to the drains of the FETs 910 and 914, and a source terminal that connects to ground.

The mirror circuit 902 includes three paths to the terminal NR. A first path includes a PMOS FET 916 and a NMOS FET 918 connected in series, a second path includes a PMOS FET 922 and a NMOS FET 924 connected in series, and a third path includes a PMOS FET 928 and a NMOS FET 930 connected in series. The PMOS FETs 916, 922 and 928 have their source terminals connected to a positive voltage source (VDD) and have their gate terminals commonly connected. The drain terminals of the PMOS FETs 916, 922 and 928 are respectively connected to the drain terminals of the NMOS FETs 918, 924 and 930. The source terminals of the NMOS FETs 918, 924 and 930 are all connected to the terminal NR. The NMOS FETs 918, 924 and 930 are controlled by voltage control signals (DW1, DW2 and DW3) are used to provide the reference voltages to the sense amplifier 900. As noted above with respect to FIG. 8, these reference voltages are used to program the more than two (e.g., 4) threshold voltage levels (Vth). It should be noted that the NMOS FETs 918, 924 and 930 represent the FETs 802, 804 and 806 shown in FIG. 8. The sense amplifier 900 also includes a switching control transistor 919. In this embodiment, the switching control transistor 919 is a NMOS FET having a drain terminal connected to the source terminals of the NMOS FETs 918, 924 and 930, having a source terminal connected to ground, and having a gate terminal connected to receive the program request signal bar (PGMB). The switching control transistor 919 is on to help pull the terminal NR low when programming is not being requested (e.g., during reading). During programming, the terminal NR is coupled to the ground line (GL) and the switching control transistor 919 is off.

The output circuit 908 is coupled to the mirror circuit 902 and produces the program enable signal (PENB) and bit0 and bit1 outputs. The output circuit 908 includes inverters 920, 926 and 932, a NOR gate 934, and an encoder 936. The inverter 920 couples an input terminal to the drains of the FETs 916 and 918 and produces a first sensed indicator (SAB1) at its output terminal. The inverter 926 couples an input terminal to the drains of the FETs 922 and 924 and produces a second sensed indicator (SAB2) at its output terminal. The inverter 932 couples an input terminal to the drains of the FETs 928 and 930 and produces a third sensed indicator (SAB3) at its output terminal. The NOR gate 934 operates to exclusive-ORs the first, second and third sensed indicators (SAB1, SAB2, and SAB3) to produce the program enable signal bar (PENB) while programming. The encoder 936 also receives the first, second and third sensed indicators (SAB1, SAB2, and SAB3) as inputs and produces the bit0 and bit1 outputs while editing.

FIG. 10 is a schematic diagram for an electronically programmable semiconductor memory device 1000 according to still another embodiment of the invention. The electronically programmable semiconductor memory device 1000 illustrates a circuit diagram illustrating an internal structure of an array of floating gate memory cells in accordance with an aspect of the present invention. The array includes a plurality of floating gate memory cells (C0, C1, ..., C6) arranged and selectable within programming block 1003. The floating gate memory cells are coupled source to drain to form rows of floating gate memory cells. For example, row 0 is illustrated as including the floating gate memory cells C0,0, ..., C0,9. All control gates for the floating gate memory cells in a row are coupled to the same wordline (SWL). For example, for row 0 the floating gate memory cells C0,0, ..., C0,9. All have their control gate connected to the wordline SWL0. Bank selection lines BWLn-1 and BWLn are used to select one of two blocks within the programming block 1003. Each block receives the wordlines SWL1 through SWL31 to activate an appropriate row in the selected block of the array.

The electronically programmable semiconductor memory device 1000 also includes a column select block 1004 and a bit line pull-up block 1002. The column select block 1004 contains column select lines and circuitry under the control of inputs signals DWL and DWR to selectively couple associated bit lines and grounds lines. The bit line pull-up block 1002 contains circuitry which couples selected bits lines, via input signal VCP, to appropriate voltage levels (e.g., 2.0 volts while VDD=6.25 volts) for programming the memory cells.

The electronically programmable semiconductor memory device 1000 further includes a current limiter circuit 1006 and a drive circuit 1008. The current limiter circuit 1006 provides a controlled level TYPO (or VGP) using the control signals PGM, YPB and a signal from a current mirror 1007. The controlled level VGP during programming implements a ground pull-down scheme. The drive circuit 1008 utilizes input signals VCP, YG0 and YG1. Select lines 1012, individually labeled as YSO-YS2, and YSP0-SP2, emanate from a decoder circuit (not shown) which selects the desired bit lines (BL) and ground lines (GL). The operation of a similar memory cell array is described in further detail in co-pending U.S. patent application Ser. No. 08/918,796, filed Aug. 26, 1997 now U.S. Pat. No. 5,959,892, and entitled "Apparatus and Method for Programming Virtual Ground EPROM Array Cell Without Disturbing Adjacent Cells", which is hereby incorporated by reference as is fully set forth herein. A sense amplifier (SA) 1020 is also shown which corresponds to data output D0, and a sense amplifier (SA) 1022 is shown which corresponds to data output D8. A data-in buffer (DINB) 1024 for data0 and data-in buffer (DINB) 1026 for data8 are also shown coupled to a respective output lines DL.

In an embodiment of the invention having signals as shown in the timing diagram 700 described above in FIG. 7, the voltage programming signal (VGP) is kept on a constant level during programming (after t3 in FIG. 7) and three different reference voltage signal (VRF) levels are used to obtain four different threshold voltage (Vth) levels. As an example, the three different reference voltage (VRF) levels can be obtained by the programmed voltage-current generator circuit 800 using FET transistors (dummy cells) as shown in FIG. 8. Various alternative embodiments are also possible. In one alternative embodiment, the reference voltage signal (VRF) is fixed at a constant level and three different voltage programming signal (VPG) levels are used to obtain four different threshold voltage (Vth) levels.

Additionally, if the slew rate at the source side voltage of the memory cell being programmed is fast, the distribution of the threshold voltage (Vth) will not be uniform. To improve distribution, the voltage programming signal (VPG) can be pulsed in any of the above embodiments. By pulsing the voltage programming signal (VPG), the rate of programming can be slowed and thus distribution improved.

An additional enhancement to reduce stress on the circuitry is to compare the currently stored data in the memory cell before the output line (DL) transitions to a high level for programming. The comparison is used to determine if programming is needed or not, when programming is not needed it is avoided.

The invention has numerous advantages. Different implementations or embodiments of the invention may have one or more of the following advantages. One advantage is that memory cells are able to be programmed at high speed. Another advantage is that the verification circuits also make efficient use of die area of the semiconductor memory device such that each bit line in a memory cell array can practically have its own verification (program control) circuit. Still another advantage of the invention is that different threshold voltage levels can be simultaneously programmed in memory cells of different bit lines.

The many features and advantages of the present invention are apparent from the written description, and thus, it is intended by the appended claims to cover all such features and advantages of the invention. Further, since numerous modifications and changes will readily occur to those skilled in the art, it is not desired to limit the invention to the exact construction and operation as illustrated and described. Hence, all suitable modifications and equivalents may be resorted to as falling within the scope of the invention.

What is claimed is:

1. A semiconductor memory device, comprising:
   a plurality of floating gate memory cells, each of said memory cells can be programmed to three or more different threshold voltage levels; and
   a plurality of memory cell program circuits, each of said memory cell program circuits being simultaneously operatively connected to one of said memory cells, and each of said memory cell program circuits operates to simultaneously program any one of the different threshold voltage levels to the corresponding one of said memory cells while using source side monitoring to concurrently determine when the programming is complete,
   wherein at least one of said cell program circuits comprise a programmable voltage-current generator coupled to a source terminal of the corresponding one of said memory cells, and
   wherein said programmable voltage-current generator determines the one of the different threshold voltage levels stored in the corresponding one of said memory cells.

2. A semiconductor memory device, comprising:
   a plurality of floating gate memory cells, each of said memory cells can be programmed to three or more different threshold voltage levels; and
   a plurality of memory cell program circuits, each of said memory cell program circuits being simultaneously operatively connected to one of said memory cells, and each of said memory cell program circuits operates to simultaneously program any one of the different threshold voltage levels to the corresponding one of said memory cells while using source side monitoring to concurrently determine when the programming is complete,
   wherein each of said memory cell program circuits comprise a programmable voltage-current generator coupled to a source terminal of the corresponding one of said memory cells, and
   wherein said programmable voltage-current generator determines the one of the different threshold voltage levels stored in the corresponding one of said memory cells.

3. A semiconductor memory device as recited in claim 2, wherein said programmable voltage-current generator for each of said memory cell program circuits comprises a plurality of field effect transistors that provide current levels associated with the threshold voltage levels to be programmed in said memory cells.

4. A semiconductor memory device as recited in claim 3, wherein each of said memory cells has a gate terminal, a source terminal, a drain terminal, and a floating gate, and
   wherein said plurality of said field effect transistors for each of said memory cell program circuits are, as a group, connected in parallel with the source terminal of the one of said memory cells corresponding thereto.

5. A semiconductor memory device comprising:
   a plurality of floating gate memory cells, each of said memory cells can be programmed to three or more different threshold voltage levels; and
   a plurality of memory cell program circuits, each of said memory cell program circuits being simultaneously operatively connected to one of said memory cells, and each of said memory cell program circuits operates to simultaneously program any one of the different threshold voltage levels to the corresponding one of said memory cells while using source side monitoring to concurrently determine when the programming is complete,
   wherein each of said memory cells has a source terminal, a source terminal, a drain terminal, and a floating gate, and
   wherein each of said memory cell program circuits comprise a program current controller that resistively couples the source terminal of the corresponding one of the memory cells to a predetermined low voltage potential during programming of the threshold voltage.

6. A semiconductor memory device as recited in claim 5, wherein during programming of the threshold voltage, a control signal is supplied to said program current controller so that the source terminal of the corresponding one of the memory cells is periodically coupled and decoupled from the predetermined low voltage potential.

7. A semiconductor memory device as recited in claim 5, wherein each of said memory cell program circuits further comprise a programmable voltage-current generator coupled to the source terminal of the corresponding one of said memory cells, and
   wherein said program current controller determines the one of the different threshold voltage levels stored in the corresponding one of said memory cells.

8. A semiconductor memory device as recited in claim 5, wherein each of said memory cell program circuits further comprise a programmable voltage-current generator coupled to the source terminal of the corresponding one of said memory cells, and
   wherein said programmable voltage-current generator determines the one of the different threshold voltage levels stored in the corresponding one of said memory cells.

9. A semiconductor memory device as recited in claim 8, wherein during programming of the threshold voltage, a reference signal is supplied to said programmable voltage-current generator to produce a current level used in determining the one of the different threshold voltage levels stored in the corresponding one of the memory cells.

10. A semiconductor memory device as recited in claim 9, wherein during programming of the threshold voltage, a control signal is supplied to said program current controller so that the source terminal of the corresponding one of the memory cells is periodically coupled and decoupled from the predetermined low voltage potential.

11. A semiconductor memory device as recited in claim 8, wherein said programmable voltage-current generator for each of said memory cell program circuits comprises a plurality of field effect transistors that provide voltage-current generator associated with the threshold voltage levels to be programmed in said memory cells.

12. A semiconductor memory device as recited in claim 11, wherein each of said memory cell program circuits further comprise a program controller operatively connected to monitor the source side voltage after said predetermined voltage-current generator and to cease programming the corresponding one of said memory cells when the monitored source side voltage after said predetermined voltage-current generator reaches a predetermined level.

13. An electrically programmable semiconductor memory device, comprising:

a word line;

a memory cell transistor having a programmable threshold voltage, a drain terminal, a gate terminal, a source terminal and a floating gate, the gate terminal being connected to said word line;

a reference level transistor having a drain terminal, a gate terminal and a source terminal, the gate terminal receiving a reference level signal, and the drain terminal being connected to the source terminal of said memory cell transistor;

a sense amplifier having an input terminal operatively connected to the source terminal of said reference level transistor, said sense amplifier detects a predetermined signal level on the input terminal; and a program controller operatively connected to said sense amplifier and the drain terminal of said memory cell transistor, said program controller supplies a high voltage signal to the drain terminal of said memory cell transistor during programming, and when said sense amplifier detects the predetermined signal level on the input terminal the programming of said memory cell transistor is stopped by removing the high voltage signal from the drain terminal of said memory cell transistor.

14. An electrically programmable semiconductor memory device as recited in claim 13, wherein the programmable threshold voltages include three or more different threshold voltages, and wherein a desired current level provided by said reference level transistor is determined based on the desired one of the different threshold voltages to be programmed into said memory cell transistor.

15. An electrically programmable semiconductor memory device as recited in claim 14, wherein one of the different threshold voltages to be stored in said memory cell transistor is determined based on input data value to be stored in said memory cell transistor.

16. An electrically programmable semiconductor memory device as recited in claim 14, wherein said reference level transistor includes a plurality of reference transistors, one or more of said reference transistors being used to facilitate the programming of the different threshold voltages in said memory cell transistor.

17. An electrically programmable semiconductor memory device as recited in claim 16, wherein said reference transistors are arrange in parallel.

18. An electrically programmable semiconductor memory device as recited in claim 16, wherein the reference level signal is used to control said reference transistors such that the desired current level is obtained over the one or more of said reference transistors.

19. An electrically programmable semiconductor memory device as recited in claim 13, wherein said electrically programmable semiconductor memory device further comprises:

a program current transistor having a drain terminal connected to the source terminal of said memory cell transistor, a source terminal connected to a low voltage source, and a gate terminal that receives a programming signal that at least partially activates said program current transistor during programming.

20. An electrically programmable semiconductor memory device as recited in claim 19, wherein the low voltage source is ground.

21. An electrically programmable semiconductor memory device as recited in claim 19, wherein during programming of the threshold voltage said program current transistor operates to discharge current from the source terminal of said memory cell transistor.

22. An electrically programmable semiconductor memory device as recited in claim 21, wherein the programmable threshold voltages include three or more different threshold voltages, and wherein a desired current level provided by said reference level transistor is determined based on the desired one of the different threshold voltages to be programmed into said memory cell transistor.

23. An electrically programmable semiconductor memory device as recited in claim 22, wherein one of the different threshold voltages to be stored in said memory cell transistor is determined based on input data value to be stored in said memory cell transistor.

24. An electrically programmable semiconductor memory device as recited in claim 23, wherein said reference level transistor includes a plurality of reference transistors, one or more of said reference transistors being used to facilitate the programming of the different threshold voltages in said memory cell transistor.

25. An electrically programmable semiconductor memory device as recited in claim 24, wherein said reference transistors are arrange in parallel.

26. An electrically programmable semiconductor memory device as recited in claim 24, wherein the reference level signal is used to control said reference transistors such that the desired current level is obtained over the one or more of said reference transistors.

27. A semiconductor memory device, comprising:

an array of floating gate memory cells, each of said memory cells can be programmed to three or more different threshold voltage levels; and a plurality of cell program means for simultaneously programming any one of the different threshold voltage levels in the corresponding one of said memory cells while using source side monitoring to concurrently determine when the programming is complete, whereby different threshold voltage levels are concurrently programmed into different ones of said memory cells, wherein each of said cell program means comprise a programmable voltage-current generator coupled to a source terminal of the corresponding one of said memory cells, and wherein said programmable voltage-current generator determines the one of the different threshold voltage levels stored in the corresponding one of said memory cells.

* * * * *